United States Patent
Agorio (10) Patent No.: US 6,697,096 B2
(45) Date of Patent: Feb. 24, 2004

(54) LASER BEAM PATTERN GENERATOR HAVING ROTATING SCANNER COMPENSATOR AND METHOD

(75) Inventor: Enrique Rodrigo Agorio, Hillsboro, OR (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/991,251

(22) Filed: Nov. 16, 2001

(65) Prior Publication Data

US 2003/0095175 A1 May 22, 2003

(51) Int. Cl.[7] .............................. B41J 27/00; B41J 15/14
(52) U.S. Cl. ........................................ 347/261; 347/243
(58) Field of Search ................................ 347/234, 241, 347/243, 247, 248, 256, 259, 260, 261, 237

(56) References Cited

U.S. PATENT DOCUMENTS

| | | | |
|---|---|---|---|
| 4,002,830 A | 1/1977 | Brown et al. | 358/481 |
| 4,796,038 A | 1/1989 | Allen et al. | 396/548 |
| 5,046,796 A | 9/1991 | Andoh et al. | 359/216 |
| 5,386,221 A | 1/1995 | Allen et al. | 347/239 |
| 5,594,556 A * | 1/1997 | Vronsky et al. | 358/482 |
| 5,999,302 A | 12/1999 | Sweeney et al. | 359/216 |
| 6,084,706 A | 7/2000 | Tamkin et al. | 359/366 |

OTHER PUBLICATIONS

PCT Search Report dated Aug. 28, 2003, European Patent Office, P.B. 5818 Patentiaan Z, NL–2280 HV Rijswijk.

* cited by examiner

Primary Examiner—Hai Pham
(74) Attorney, Agent, or Firm—Janah & Associates (57) ABSTRACT

A laser beam pattern generator has a substrate support capable of supporting a substrate, the substrate support having a support motor capable of moving the substrate support. A laser beam source is provided that is capable of generating a laser beam. A beam modulator is also provided that is capable of modulating the intensity of the laser beam according to a pattern. A rotating scanner is provided that has a plurality of mirror facets capable of rotating at a spinning frequency to scan the laser beam across the substrate. The laser beam pattern generator also has a rotating scanner compensator to deflect the laser beam according to a rotating scanner correction signal containing a harmonic of the spinning frequency to compensate for errors in the scanning of the laser beam arising from the rotating scanner. A controller is provided that is adapted to control the substrate support, laser beam source, beam modulator, rotating scanner, and rotating scanner compensator to modulate and scan the laser beam across the substrate to generate the pattern on the substrate.

26 Claims, 5 Drawing Sheets

Rotational Scanner Error in Frequency Domain

LASER BEAM PATTERN GENERATOR HAVING ROTATING SCANNER COMPENSATOR AND METHOD

BACKGROUND

Embodiments of the present invention relate to the generation of a laser beam pattern on a substrate.

A laser beam pattern generator modulates and scans a laser beam onto a substrate to generate a pattern on the substrate. The laser beam is modulated in accordance with the pattern to be generated on the substrate. For example, a typical pattern generator comprises a substrate support to hold the substrate, and laser beam source, focusing, modulating, and scanning components, to generate, modulate, and scan a laser beam across the substrate to form a laser beam pattern on the substrate. The substrate support comprises a support motor to move the substrate support in coordination with the beam scanning component. Typically, the scanning component is a rotating scanner comprising a plurality of mirror facets. The substrate may be, for example, a mask blank used to fabricate semiconductors, that is exposed to the modulated laser beam to write a circuit image onto photosensitive material of the mask blank. The mask blank is then developed and stabilized to form a mask for the fabrication of integrated circuits.

It is desirable to be able to use the mask to generate high resolution laser beam patterns, with good accuracy, on a substrate. However, in practice the resolution of the laser beam generated pattern is often degraded by substrate positioning defects occurring in the laser beam pattern generator. For example, the support motor may not accurately or reproducibly move the substrate support so that the resultant position of the substrate is not its desired location. In conventional laser beam pattern generator systems, the erroneous stage and substrate position may be determined, by for example, methods such as interferometry. The position of the laser beam is then adjusted by deflecting the laser beam a suitable amount to compensate for the improper substrate position, by for example, deflecting a steering mirror system, as for example, described in
U.S. Pat. No. 4,796,038 to Allen et al, entitled "Laser Pattern Generation Apparatus," which is incorporated herein by reference in its entirety. While such correction methods improve the resolution and accuracy of the laser beam pattern generation, the resolution is still not as fine as that desirable, and the accuracy is also not as good as needed. Thus, it is desirable to have a laser beam pattern generator and method to generate higher resolution and more accurate laser beam scanning patterns.

SUMMARY

A laser beam pattern generator comprising:
a substrate support capable of supporting a substrate, the substrate support comprising a support motor;
a laser beam source to generate a laser beam;
a beam modulator to modulate the intensity of the laser beam according to a pattern;
a rotating scanner comprising a plurality of mirror facets capable of rotating at a spinning frequency to scan the laser beam across the substrate;
a rotating scanner compensator to deflect the laser beam according to a rotating scanner correction signal comprising a harmonic of the spinning frequency to compensate for errors in the scanning of the laser beam arising from the rotating scanner; and
a controller comprising program code to control the substrate support, laser beam source, beam modulator, rotating scanner, and rotating scanner compensator, to modulate and scan the laser beam across the substrate to generate the pattern on the substrate,
whereby a corrected laser beam pattern is generated on the substrate.

A laser beam pattern generator comprising:
a substrate support capable of supporting a substrate, the substrate support comprising a support motor;
a laser beam source to generate a laser beam;
a beam modulator to modulate the intensity of the laser beam according to a pattern;
a rotating scanner comprising a plurality of mirror facets capable of rotating at a spinning frequency to scan the laser beam across the substrate;
a rotating scanner compensator to deflect the laser beam according to a rotating scanner correction signal to compensate for errors in the scanning of the laser beam arising from the rotating scanner; and
a controller comprising program code to control the substrate support, laser beam source, beam modulator, rotating scanner, and rotating scanner compensator to modulate and scan the laser beam across the substrate to generate the pattern on the substrate, the controller adapted to generate the rotating scanner correction signal of the form $\Sigma A_n \sin(n\omega t + \phi_n)$, where $A_n$ is a coefficient, t is time, n is the order of the harmonic, $\omega$ is the spinning frequency, and $\phi_n$ is a phase shift, to compensate for errors in the scanning of the laser beam arising from the rotating scanner, and pass the signal to the rotating scanner compensator,
whereby a corrected laser beam pattern is generated on the substrate.

A method of generating a pattern on a substrate comprises placing a substrate on a substrate support, generating a laser beam, modulating the intensity of the laser beam according to a pattern, rotating a beam scanner at a spinning frequency to scan the laser beam across the substrate, and deflecting the laser beam according to a rotating scanner correction signal that comprises a harmonic of the spinning frequency to compensate for errors in the scanning of the laser beam arising from the rotating scanner, thereby generating the pattern on the substrate.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

DESCRIPTION

Figure 1:
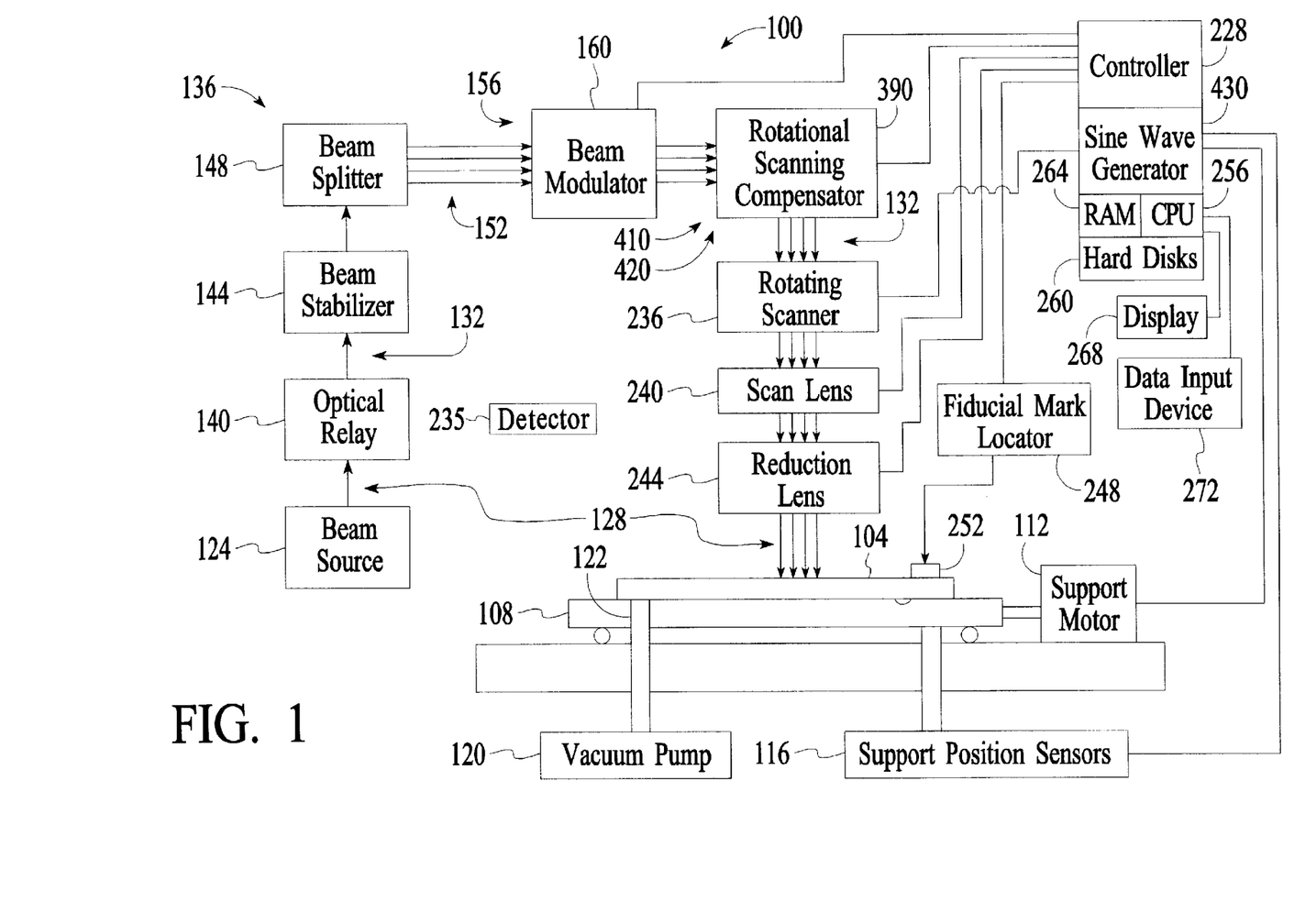
FIG. 1 is a schematic diagram of a laser beam pattern generator having a rotating scanner compensator according to an embodiment of the present invention.

A laser beam pattern generator according to the present invention is used to generate a pattern on a substrate. An exemplary version of a pattern generator 100, as schematically illustrated in FIG. 1, is suitable for generating a pattern, which is typically a pattern representative of electronic circuitry or an electronic device, on a substrate 104, such as a substrate suitable for use in the fabrication of integrated circuits. For example, the pattern generator 100 may be a mask-making apparatus suitable for generating the pattern on a substrate 104 such as a mask blank. The substrate 104 is exposed in the pattern generator 100 to a modulated laser beam 128 to generate a pattern in photosensitive material of the mask blank. The mask blank is then developed and stabilized to fix the pattern and used in the fabrication of integrated circuits. The illustrative version of the pattern generator 100 provided herein should not be used to limit the scope of the invention, and the invention encompasses equivalent or alternative versions, as would be apparent to one of ordinary skill in the art.

Generally, the pattern generator 100 comprises a substrate support 108 capable of supporting the substrate 104. The substrate support 108 has a support motor 112 to move the substrate support 108 to position the substrate 104. For example, the support motor 112 may comprise an electric motor capable of translating the substrate support 108 in the x and y directions along an x-y plane parallel to the substrate surface, rotate the substrate support 108, move the substrate support 108 vertically up and down along the axis orthogonal to its plane, or tilt the substrate support 108. Support position sensors 116 are provided that are capable of precisely determining the position of the substrate support 108 and of the substrate 104 itself. For example, the support position sensors 116 may reflect a light beam (not shown) from the substrate support 108 or substrate 104 to measure its position interferometrically. A vacuum pump 120 and vacuum port 122, which may be a channel extending circumferentially below the substrate 104, are additionally provided to securely hold the substrate 104 by vacuum force.

A laser beam source 124 is provided to generate a laser beam 128 that travels along a beam path 132 to the substrate 104. The laser beam source 124 may be, for example, a substantially coherent light source, producing light in the ultraviolet, visible, or infrared parts of the frequency spectrum. In the exemplary version, the laser beam source 124 generates a collimated multi-wavelength laser beam, such as a continuous-wave ultraviolet laser beam having primary spectral lines at wavelengths 351 nm, 364 nm and 380 nm, and emanating from an Argon ion laser, commercially available from Coherent, Inc., Santa Clara, Calif. Multiple laser beam sources may also be used instead of a single laser beam source. A number of optical beam components 136 are also provided in the beam path 132 to optically modify the laser beam 128. For example, the optical components 136 may include an optical relay 140 capable of passively shaping the laser beam 128 to a suitable shape.

Figure 2:
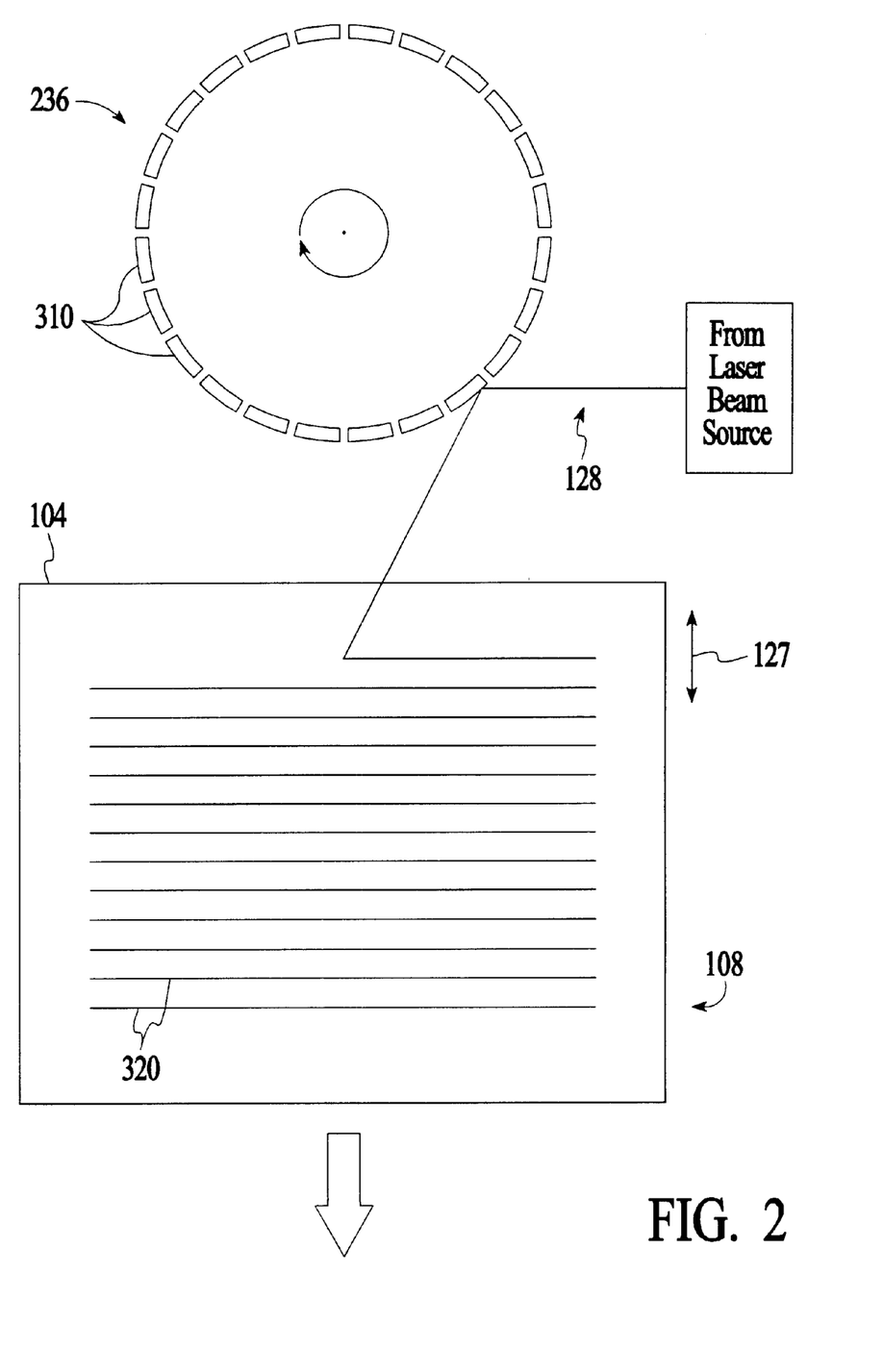
FIG. 2 is a perspective view of a rotating scanner having mirror facets that rotate at a spinning frequency to scan a laser beam across a substrate.

The laser beam pattern generator 100 comprises a rotating scanner 236 comprising a plurality of mirror facets 310 capable of rotating at a spinning frequency to scan the laser beam 128 across the substrate 104 along scan lines 320, as shown in FIG. 2. The spinning frequency may be from about 20 to about 800 Hz, such as about 328 Hz. In one version, the rotating scanner 236 has a polygonal shape with at least about 20 mirror facets 310, for example, about 24 mirror facets, at each side of the polygon shape. Each mirror facet 310 typically scans the laser beam 128 along one scan line 320 across the surface of the substrate 104. For example, in the embodiment where the rotating scanner 236 comprises 24 mirror facets 310 and the spinning frequency is 328 Hz, the rotating scanner 236 scans the laser beam 128 across the substrate 104 at (328 Hz×24), or 7872, times per second.

Figure 3A:
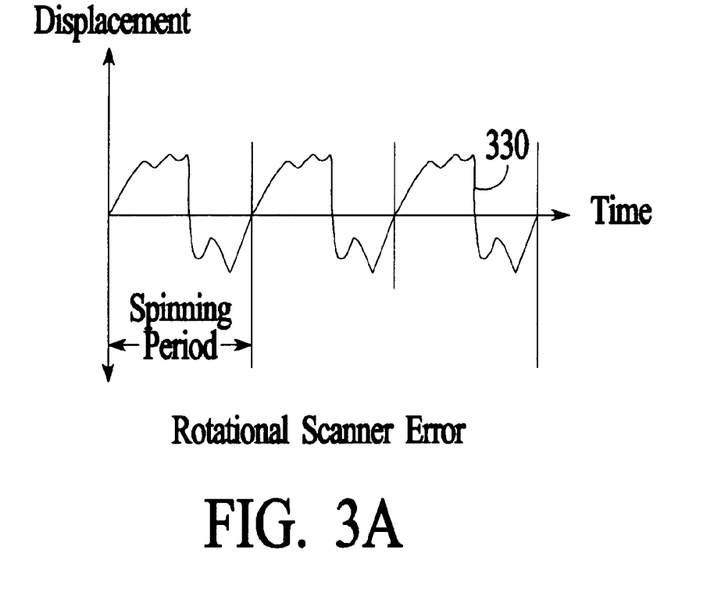
FIG. 3a is a plot of a scanning error that arises in the scanning of the laser beam due to the rotational movement of the rotating scanner.

It has been determined that the rotating scanner 236 causes periodic errors in the scanning of the laser beam 128 across the substrate 104 due to its rotational motion at the spinning frequency and that the periodic errors have frequencies that are integral multiples of the spinning frequency. The errors are typically along a stripe axis 127 that is substantially orthogonal to the scan lines 320. The errors can be plotted as a curve 330, as illustrated in FIG. 3a. In one embodiment, the rotating scanner 236 is mounted on a rotating axle of a motor to rotate the rotating scanner 236. A defect in the construction or a mounting misalignment of the rotating scanner 236 on the axle may produce a wobble of the rotating scanner 236 and a corresponding wobble of the laser beam 128 along the stripe axis 127. This wobble may, for example, correspond strongly to the first harmonic of the spinning frequency.

It has been discovered that defects in the rotating scanner 236 can result in the loss of resolution and accuracy of the laser beam scanning pattern. For example, misalignment of the rotating scanner 236 can cause a wobble in the path of the laser beam 128 scanned across the substrate 104. It has been further discovered that the rotating scanner 236 often has small defects in the alignment or planarity of the mirror facet 310, such as originating from the fabrication or assembly of the mirror facet 310 or from subsequent damage to the facet 310. Such defects in the mirror facets 310 can cause the laser beam 128 to be slightly deflected away from its intended path. Because the mirror facets 310 are rotating at the spinning frequency, the laser beam 128 is undesirably deflected at a frequency that corresponds to the spinning frequency.

Additionally, vibrations in the laser beam pattern generator 100 can displace the laser beam 128 from its intended path on the substrate 104 and thereby cause errors in the generation of the pattern on the substrate 104. It has been found, for example, that the rotating scanner 236 may cause vibrations of the laser beam pattern generator 100 at a frequency that is an integer multiple of the spinning frequency, otherwise referred to as a harmonic of the spinning frequency. For example, the rotating scanner 236 may cause vibrations that resonate in one or more of the optical components 136, laser beam source 124, or substrate support 108. Typically, one or more of the above-described errors compound to form a scanning error that is complicated in origin, such as shown in FIG. 3a. However, this compound error is typically substantially periodic, largely composed of a sum of harmonics of the spinning frequency.

In one version, a knife edge method is used to determine the scanning error. In this method, the laser beam 128 is scanned across a reticle having a slit or reflective line in the longitudinal direction of the slit or reflective line. A laser beam detector 235 detects the intensity of the laser beam 128 emerging from the slit or reflective line to determine the positional error of the laser beam 128 along its scan line 320. For example, if the detected portion of the laser beam 128 has an intensity that is one-half of the total intensity of the laser beam 128, the laser beam 128 may be determined to be about half-way outside of the slit.

Returning to FIG. 1, the laser beam pattern generator 100 further comprises a rotating scanner compensator 390 to deflect the laser beam 128 according to a rotating scanner correction signal comprising a harmonic of the spinning frequency to compensate for errors in the scanning of the laser beam 128 arising from the rotating scanner 236. For example, if the rotating scanner 236 is scanning the laser beam 128 forward along a scan line 320 on the substrate 104, and suddenly a polygon scanning error causes the laser beam 128 to erroneously deflect to the left along the stripe axis 127, the rotating scanner compensator 390 deflects the laser beam 128 to the right to compensate for the erroneous deflection.

In one version, the rotating scanner compensator 390 comprises a steering mirror 410 and a motor 420 to controllably pivot the steering mirror 410. The steering motor 420 is adapted to receive signals to pivot the steering mirror 410 such that the laser beam 128 is deflected by reflecting the laser beam 128. The steering motor 420 may comprise an electrical motor that receives electrical signals and moves the steering mirror 410 according to the electrical signals.

The optical beam components 136 may further comprise a beam splitter 148 to split the laser beam 128 into a plurality of laser beamlets 152. In one version, the beam splitter 148 comprises a number of parallel plates that split the laser beam 128 to comprise a number of spatially separated beamlets 152 that each have approximately the same radiative intensity, as for example, described in U.S. Pat. No. 5,386,221, which is incorporated herein by reference in its entirety. In another version, the beam splitter 148 is a diffractive beam splitter comprising fixed diffraction gratings that are constructed to split the laser beam 128 into a plurality of beamlets 152 having different orders, as for example, described in Feldman, et al., Optics Letters, Vol. 14, pp.479 to 481, which is incorporated herein by reference in its entirety. Suitable diffractive optical beam splitters 148 are manufactured by Rochester Photonics Corp., Rochester, N.Y. The beam splitter 148 typically splits the laser beam 128 into, for example, from about 20 beamlets to about 2000 beamlets, and in one embodiment about 32 beamlets. Thus, the laser beam 128 may be a single beam or a number of beamlets 152.

The pattern generator 100 further comprises a beam modulator 136 to modulate the intensity of the laser beam 128 according to the pattern. In one version, the beam modulator 160 is an acousto-optic modulator that operates by causing constructive or destructive interference of the laser beam 128. The beam modulator 160 typically comprises a piezoelectric crystal (not shown) to which is attached a transducer (not shown) that generates compressional vibrations in the crystal to modulate the beam 128.

A fiducial mark locator 248 may be provided to measure the actual locations of fiducial marks 252 of the substrate 104 to determine the position of the substrate 104, a distortion of the substrate 104, or a correctness of a pattern generated on the substrate 104. The fiducial marks 252 may be holes, light reflective markings, diffraction gratings, or previously generated spots or images. The fiducial mark locator 248 generally comprises an optical detector capable of detecting the fiducial marks 252 of the substrate 104, such as a charge-coupled device (CCD) camera. The optical detector monitors a change in the light transmitted through, or reflected back from, the substrate 104 to determine the actual locations of the fiducial marks 252 of the substrate 104.

A controller 228 comprising a suitable configuration of hardware, software, or programmable logic devices, is adapted to control the substrate support 108, laser beam source 124, beam modulator 160, rotating scanner 236, and rotating scanner compensator 390 to modulate and scan the laser beam 128 across the substrate 104 to correctly generate the pattern on the substrate 104. For example, the controller 228 generates the rotating scanner correction signal, or other correction signals, and transmits the correction signals to the rotating scanner compensator 390. One or more of the other correction signals may be transmitted to the beam modulator 160 to adjust a timing of beam modulation, or to the support motor 112 to move the substrate support 108. The controller 228 is adapted to receive data, calculate the location of the substrate 104 or substrate distortion levels, determine a correction operator for the stored pattern, and operate the beam source 124 and optical beam components 136. In one exemplary embodiment, the controller 228 receives data of the measured locations of the fiducial marks 252 and compares them to their original or design locations to determine the deviation of each fiducial mark 252. The fiducial mark deviations are used to correct the encoded pattern to be generated on the substrate 104. In operation, the substrate 104, on which a pattern is to be generated, is placed on, and held by, the substrate support 108. The controller 228 then controls, for example, the beam modulator 160, rotating scanner 236, and rotating scanner compensator 390 to correctly generate the pattern on the substrate 104. For example, the controller 228 sends signals to the beam modulator 160 to control pulsing of the laser beam 128 to the desired intensity levels and in correspondence to the pattern. The controller 228 may also control the beam modulator 160 to scale the pattern in the scanning direction by timing the beam pulses. The support motor 112 also receives real time instructions from the controller 228 to control the motion of the substrate support 108, and consequently the substrate 104, to scale, rotate, or translate the pattern projected onto the substrate 104. Typically, an array of laser beamlets 152 is scanned across the substrate 104 in nearly horizontal passes which are repeated along a first vertical stripe, after which the beamlets 152 are scanned in second horizontal passes along a second vertical stripe, and so forth. Thus, the controller 228 operates the laser beam source 124, beam modulator 160, rotating scanner 236, rotating scanner compensator 390, and support motor 112 to raster scan the laser beam 128 across the substrate 104 in multiple passes.

The controller 228 may be a computer that executes software of a computer-readable program residing in a computer system comprising a central processing unit (CPU) 256, such as for example, a Pentium Controller commercially available from Intel Corporation, Santa Clara, Calif., that is coupled to a memory and peripheral computer components. For example, the memory may comprise a computer readable medium having the computer readable program therein. The memory may be hard disks 260, an optical compact disc (CD), floppy disk, random access memory (RAM) 264, or other types of volatile or non-volatile memory, suitable for storing fiducial mark locations, calculated fiducial mark deviations, correction operators, or corrected patterns.

The interface between a human operator and the controller 228 can be, for example, via a display 268 and data input device 272, such as a keyboard. Other computer-readable programs such as those stored in other memory including, for example, a floppy disk or other computer program product inserted in a drive of the memory may also be used to operate the controller 228. The computer system card rack contains a single board computer, analog and digital input/output boards, interface boards, and stepper motor controller boards. Various components of the pattern generator 100 conform to the Versa Modular European (VME) standard, which defines board, card cage, and connector dimensions and types. The VME standard also defines the bus structure having a 16-bit data bus and 24-bit address bus.

The computer-readable program generally comprises software comprising a set of instructions to operate the laser beam pattern generator 100. For example, the computer-readable program may be capable of generating the rotating scanner correction signal, or other correction signals, to correct the laser beam 128. The computer-readable program can be written in any conventional programming language, such as for example, assembly language, C, C++ or Pascal. Suitable program code is entered into a single file, or multiple files, using a conventional text editor and stored or embodied in the memory of the computer system. If the entered code text is in a high-level language, the code is compiled, and the resultant compiler code is then linked with an object code of pre-compiled library routines. To execute the linked, compiled object code, the user invokes the object code, causing the CPU 256 to read and execute the code to perform the tasks identified in the program.

Figure 3B:
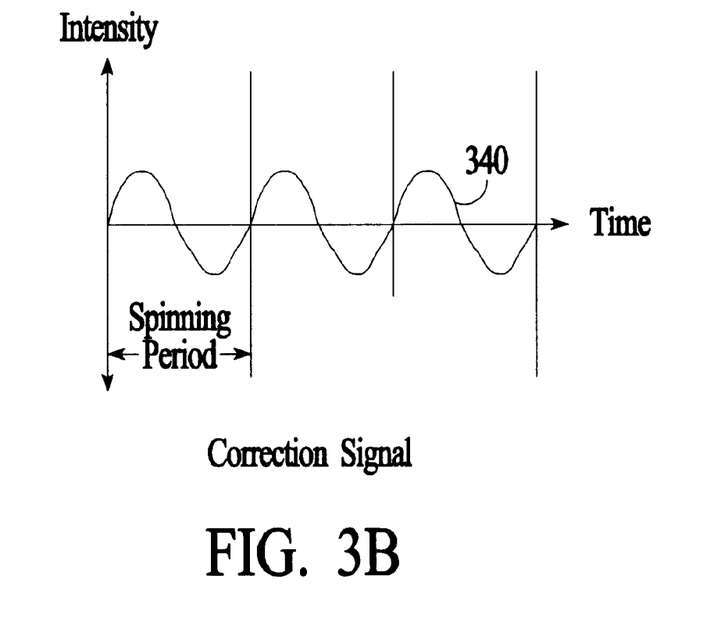
FIG. 3b is a plot of a rotating scanner correction signal comprising a first harmonic of the spinning frequency that is applied to the rotating scanner compensator.

In one version, the controller 228 generates a rotating scanner correction signal that comprises one harmonic of the spinning frequency, as illustrated in FIG. 3b. The rotating scanner correction signal comprises the form:

$$A \cdot \mathrm{Sin}(\omega t + \phi),$$

where A is an amplitude of the harmonic, t is time, $\omega$ is the spinning frequency of the rotating scanner 236, and $\phi$ is a phase shift of the harmonic. In one embodiment, the scanning error has a first harmonic component that is substantially larger than the other harmonic components, allowing a rotating scanner correction signal consisting of the first harmonic to substantially compensate for the scanning error.

The controller 228 may comprise a sine wave generator 430 to generate the rotating scanner correction signal. The sine wave generator 430 can be tuned to produce a desired sinusoidal harmonic having the desired amplitude A and phase shift $\phi$ to substantially reduce the scanning error. The sine wave generator 430 can be, for example, the "MAX038" from Maxim Integrated Products, Inc., Sunnyvale, Calif.

In one version, the rotating scanner correction signal comprises a plurality of harmonics of the spinning frequency. The rotating scanner correction signal comprises the form $$\Sigma A_n \cdot \mathrm{Sin}(n\omega t + \phi_n)$$

where $A_n$ is the amplitude of the harmonic, t is time, n is the order of the harmonic (i.e., first harmonic, second harmonic, etc.), $\omega$ is the spinning frequency, and $\phi_n$ is a phase shift. Thus, each harmonic can be stored as simply the two values $A_n$ and $\phi_n$ for the n that corresponds to that harmonic.

Figure 4:
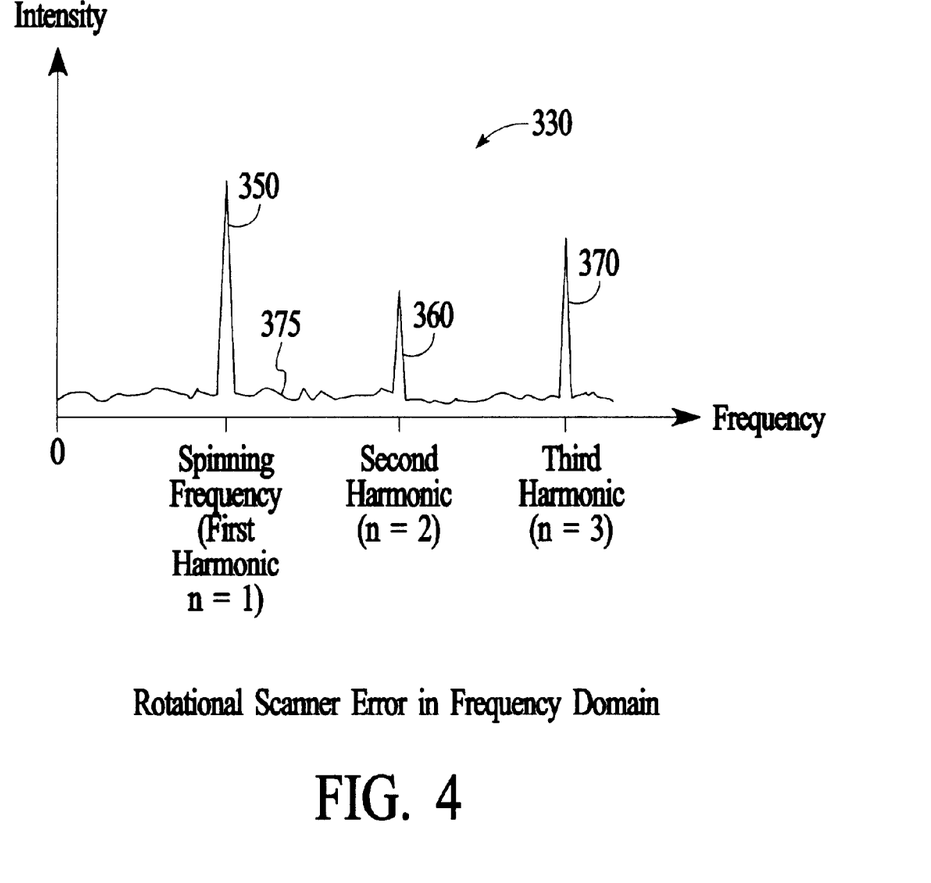
FIG. 4 is a plot of a scanning error signal trace that is Fourier decomposed to be a function of frequency.

In one embodiment, the error curve is Fourier decomposed in order to determine the two values $A_n$ and $\phi_n$ corresponding to each n, as illustrated in FIG. 4. In the example shown, the error 330 comprises large harmonic components at the first harmonic 350, second harmonic 360, and third harmonic 370, surrounded by small background components 375 at other frequencies. By transmitting a first harmonic test signal from the sine wave generator 430 to the rotating scanner compensator 390 and adjusting the amplitude A and the phase shift $\phi$ until the first harmonic 350 is sufficiently decreased, a first amplitude A and a first phase shift $\phi$ are determined. Then, a second harmonic test signal is transmitted from the sine wave generator 430 to the rotating scanner compensator 390 and the method is repeated to determine a second amplitude A and a second phase shift $\phi$, and so on for a plurality of harmonics. For example, this method can be carried out for the first harmonic 350 of the spinning frequency, then the second harmonic 360, and then the third harmonic 370. In one embodiment, this method is carried out manually by a human operator. If the rotating scanner 236 is replaced with a different rotating scanner, the method can be carried out again to determine values $A_n$ and $\phi_n$ for the different rotating scanner.

Figure 5:
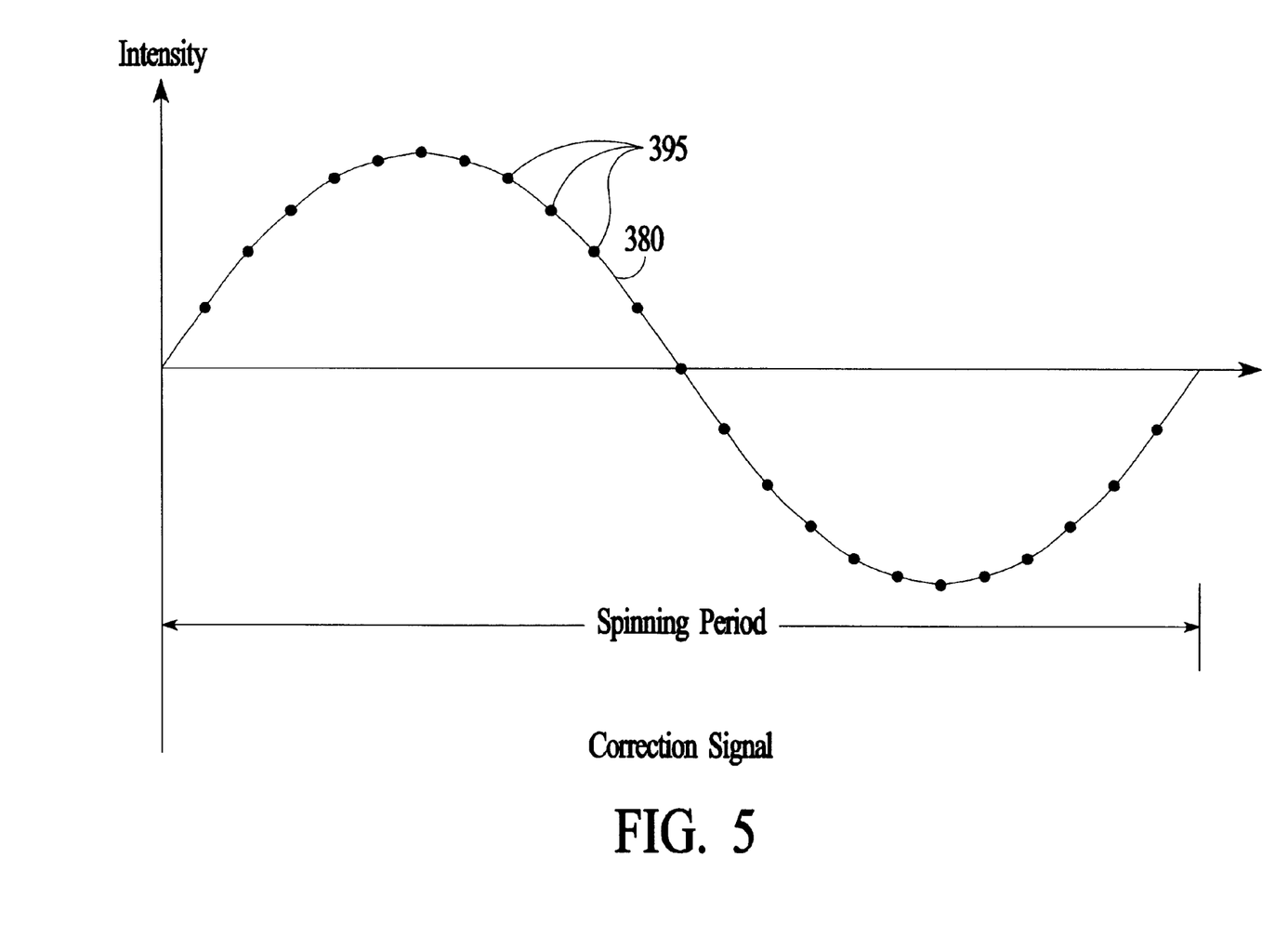
FIG. 5 is a plot of the rotating scanner correction signal of FIG. 3b and sampled points along the rotating scanner correction signal.

In one embodiment, the controller 228 converts the rotating scanner correction signal 380, which comprises the summed plurality of harmonics, into a plurality of sample values 395 to be efficiently stored in the memory of the controller 228, as illustrated in FIG. 5. During generation of the pattern on the substrate 104, the controller 228 transmits the sample values 395 to the rotating scanner compensator 390 to compensate for the rotational scanning errors along the stripe axis 127. In this way, the rotational scanning errors can be efficiently corrected without storing an unnecessarily large amount of data or exactly reproducing the complicated plurality of harmonics. For example, the rotating scanner correction signal 380 may comprise a number of sample values 395 per revolution of the rotating scanner 236 that is at least as many as the number of mirror facets 310 of the rotating scanner 236. In the embodiment shown in FIG. 5, the rotating scanner correction signal comprises 24 sample values 395 of the first harmonic 380 of the spinning frequency.

The controller 228 may store the sample values 395 in a lookup table for later access. During scanning of the laser beam 128 across the substrate 104, the controller 228 transmits the sample values 395 to the steering mirror 410. For example, if the rotating scanner 236 has 24 mirror facets 310 and the rotating scanner correction signal comprises 24 sample values 395, the controller 228 transmits one of the sample values for each new scan of the laser beam 128 by a mirror facet 310. The steering mirror 410 typically has a continuous mechanical response to electrical signals that it receives, and thus effectively smooths the sample values 395 into a good approximation of the original rotating scanner correction signal 380.

The rotating scanner compensator 390 can use the rotating scanner correction signal to predict the scanning error and accurately compensate for it because the scanning error is periodic. For example, the rotating scanner compensator 390 can produce an accuracy of pattern generation that is improved over simply doing real-time correction of the position of the laesr beam 128. For example, in a pattern generator 100 that comprises the rotating scanner compensator 390, the angular precision of the rotating scanner 236 can be improved to within less than about 0.2 arcseconds, such as less than about 0.12 arcseconds.

In one version, returning to FIG. 1, the controller 228 also adjusts the position of the laser beam 128 to compensate for a support position error that is a positional deviation of the substrate support 108 from its desired position. The support position sensors 116 may accurately determine the position of the substrate support 108 and transmit the positional information to the controller 228. The controller 228 compares the actual position of the substrate support 108 to its intended position to determine the support position error. Along the axis of beam scanning, the controller 228 can compensate for the support position error by advancing or delaying the modulation of the laser beam 128. Along the direction of the scan lines 320, the controller 228 can compensate for the support position error by deflecting the laser beam 128, such as by transmitting a support correction signal to the steering mirror 410. In one embodiment, the controller 228 electronically sums the rotating scanner correction signal and the support correction signal, then transmits the summed signal to the rotating scanner compensator 390 to correct for both the error due to the rotating scanner 236 and the error in the position of the substrate support 108.

In another version, the rotating scanner compensator 390 is also adapted to correct for precessional errors of the rotating scanner 236. The precessional errors may comprise a precessional frequency component of substantially large amplitude, but which is not a harmonic of the spinning frequency. The precessional frequency component may be determined, and a precessional correction signal comprising a harmonic of the precessional frequency may be transmitted to the rotating scanner compensator 390. For example, the controller 228 may electronically sum one or more of the rotating scanner correction signal, the support correction signal, and the precessional correction signal, then transmit the summed signal to the rotating scanner compensator 390.

In one version, a beam detector 235 is provided to detect and monitor the position of the laser beam 128 relative to the substrate support 108 in real-time, and the controller 228 generates a real-time correction signal that corresponds to the deviation of the laser beam from a desirable position. The controller 228 may then adjust the position of the laser beam 128 in real-time according to its real-time correction signal. For example, the controller 228 may sum the real-time correction signal with one of the other correction signals, and transmit this summed correction signal to the rotational scanning compensator 390.

Thus, the present pattern generator 100 and method is advantageous because it allows for more accurate generation of the pattern on the substrate 104. Although the present invention has been described in considerable detail with regard to certain preferred versions thereof, other versions are possible. For example, the present invention could be used with other pattern generators, such as a pattern generator that generates a pattern using substantially incoherent light. Thus, the appended claims should not be limited to the description of the preferred versions contained herein.

What is claimed is:

1. A laser beam pattern generator comprising:
   a substrate support capable of supporting a substrate, the substrate support comprising a support motor;
   a laser beam source to generate a laser beam;
   a beam modulator to modulate the intensity of the laser beam according to a pattern;
   a rotating scanner comprising a plurality of mirror facets capable of rotating at a spinning frequency to scan the laser beam across the substrate;
   a rotating scanner compensator to deflect the laser beam according to a rotating scanner correction signal comprising a summation of a plurality of predetermined harmonics of the spinning frequency to compensate for errors in the scanning of the laser beam arising from the rotating scanner; and
   a controller comprising program code to control the substrate support, laser beam source, beam modulator, rotating scanner, and rotating scanner compensator, to modulate and scan the laser beam across the substrate to generate the pattern on the substrate,
   whereby a corrected laser beam pattern is generated on the substrate.

2. A pattern generator according to claim 1 wherein the controller is adapted to generate a rotating scanner correction signal that corrects errors in the scanning of the laser beam caused by one or more of:
   misalignment of the rotating scanner;
   defects in the mirror facets; and
   vibrations from the rotating scanner.

3. A pattern generator according to claim 1 wherein the rotating scanner compensator comprises a steering mirror and a motor to pivot the steering mirror, the motor being adapted to receive the rotating scanner correction signal to pivot the steering mirror such that the laser beam is deflected by reflecting the laser beam.

4. A pattern generator according to claim 1 wherein the rotating scanner correction signal is of the form $\Sigma A_n \mathrm{Sin}(n\omega t+\phi_n)$, where $A_n$ is a coefficient, t is time, n is the order of the harmonic, $\omega$ is the spinning frequency, and $\phi_n$ is a phase shift.

5. A pattern generator according to claim 1 wherein the spinning frequency is from about 20 to about 800 Hz.

6. A pattern generator according to claim 1 wherein the controller is adapted to generate a support correction signal to correct for an error in a positioning of the substrate support by the support motor.

7. A pattern generator according to claim 1 wherein the controller is adapted to generate a precessional correction signal to correct for a precessional error of the rotating scanner.

8. A pattern generator according to claim 1 wherein the controller comprises a lookup table to approximate the rotating scanner correction signal, the lookup table comprising a value for each mirror facet of the rotating scanner.

9. A pattern generator according to claim 1 further comprising a beam detector adapted to monitor the position of the laser beam in real-time, wherein the controller is also adapted to generate a real-time correction signal to correct for errors in the position of the laser beam in real-time.

10. A laser beam pattern generator comprising:
    a substrate support capable of supporting a substrate, the substrate support comprising a support motor;
    a laser beam source to generate a laser beam;
    a beam modulator to modulate the intensity of the laser beam p according to a pattern;
    a rotating scanner comprising a plurality of mirror facets capable of rotating at a spinning frequency to scan the laser beam across the substrate;
    a rotating scanner compensator to deflect the laser beam according to a rotating scanner correction signal to compensate for errors in the scanning of the laser beam arising from the rotating scanner; and
    a controller comprising program code to control the substrate support, laser beam source, beam modulator, rotating scanner, and rotating scanner compensator to modulate and scan the laser beam across the substrate to generate the pattern on the substrate, the controller adapted to generate the rotating scanner correction signal comprising a summation of a plurality of predetermined harmonics of the spinning frequency, the correction signal having the form $\Sigma A_n \mathrm{Sin}(n\omega t+\phi_n)$, where $A_n$ is a coefficient, t is time, n is the order of the harmonic $\omega$ is the spinning frequency, and $\phi_n$ is a phase shift, to compensate for errors in the scanning of the laser beam arising from the rotating scanner, and pass the signal to the rotating scanner compensator, whereby a corrected laser beam pattern is generated on the substrate.

11. A pattern generator according to claim 10 wherein the controller comprises a lookup table to approximate the rotating scanner correction signal, the lookup table comprising a value for each mirror facet of the rotating scanner.

12. A pattern generator according to claim 10 wherein the controller is adapted to generate a precessional correction signal to correct for a precessional error of the rotating scanner.

13. A method of generating a pattern on a substrate, the method comprising:
   (a) placing a substrate on a substrate support;
   (b) generating a laser beam;
   (c) modulating the intensity of the laser beam according to a pattern;
   (d) rotating a beam scanner at a spinning frequency to scan the laser beam across the substrate;
   (e) determining a plurality of harmonics of the spinning frequency; and
   (f) deflecting the laser beam according to a rotating scanner correction signal that comprises a summation of the plurality of determined harmonics of the spinning frequency to compensate for errors in the scanning of the laser beam arising from the rotating scanner, thereby generating the pattern on the substrate.

14. A method according to claim 13 wherein the rotating scanner comprises a number of mirror facets and the method comprises generating a rotating scanner correction signal that corrects errors in the scanning of the laser beam caused by one or more of
   misalignment of the rotating scanner;
   defects in the mirror facets; and
   vibrations from the rotation of the rotating scanner.

15. A method according to claim 13 wherein (f) comprises pivoting a steering mirror.

16. A method according to claim 13 wherein the rotating scanner correction signal is of the form $\Sigma A_n \mathrm{Sin}(n\omega t+\phi_n)$, where $A_n$ is a coefficient, t is time, n is the order of the harmonic, $\omega$ is the spinning frequency, and $\phi_n$ is a phase shift.

17. A method according to claim 13 wherein the spinning frequency is from about 20 to about 800 Hz.

18. A method according to claim 13 wherein the rotating scanner comprises a number of mirror facets, and wherein the method further comprises looking up a rotating scanner correction signal that approximates the harmonic by a sample value for each facet.

19. A method according to claim 13 further comprising generating a precessional correction signal to correct for a precessional error of the rotating scanner.

20. A method according to claim 13 further comprising monitoring the position of the laser beam in real-time and generating a real-time correction signal to correct for errors in the position of the laser beam.

21. A laser beam pattern generator comprising:
   a substrate support capable of supporting a substrate, the substrate support comprising a support motor;
   a laser beam source to generate a laser beam;
   a beam modulator to modulate the intensity of the laser beam according to a pattern;
   a rotating scanner comprising a plurality of mirror facets capable of rotating at a spinning frequency to scan the laser beam across the substrate;
   a rotating scanner compensator to deflect the laser beam according to a rotating scanner correction signal comprising a harmonic of the spinning frequency, the correction signal being derived from a detected position of the laser beam relative to the substrate support; and
   a controller comprising program code to control the substrate support, laser beam source, beam modulator, rotating scanner, and rotating scanner compensator, to modulate and scan the laser beam across the substrate to generate the pattern on the substrate,
   whereby a corrected laser beam pattern is generated on the substrate.

22. A pattern generator according to claim 21 wherein the rotating scanner compensator comprises a steering mirror and a motor to pivot the steering mirror, the motor being adapted to receive the rotating scanner correction signal to pivot the steering mirror such that the laser beam is deflected by reflecting the laser beam.

23. A pattern generator according to claim 21 wherein the controller comprises a lookup table to approximate the rotating scanner correction signal, the lookup table comprising a value for each mirror facet of the rotating scanner.

24. A method of generating a pattern on a substrate, the substrate being held on a substrate support, the method comprising:
   (a) generating a laser beam;
   (b) rotating a beam scanner at a spinning frequency to scan the laser beam relative to the substrate support;
   (c) generating a correction signal by
      (i) detecting the laser beam position relative to the substrate support and generating a beam position signal in relation to the detected position, and
      (ii) determining a correction signal from the beam position signal, the correction signal comprising a harmonic of the spinning frequency to compensate for errors in the scanning of the laser beam arising from the rotating scanner; and
   (d) generating a pattern on a substrate by
      (i) placing a substrate on a substrate support,
      (ii) modulating the intensity of the laser beam to obtain the pattern, and
      (iii) deflecting the laser beam according to the correction signal.

25. The method of claim 24 comprising executing (c) in real-time with (d).

26. The method of claim 24 comprising executing (d) after (c).

* * * * *